United States Patent
Bingham et al.

(10) Patent No.: US 10,777,386 B2
(45) Date of Patent: Sep. 15, 2020

(54) METHODS FOR CONTROLLING PLASMA GLOW DISCHARGE IN A PLASMA CHAMBER

(71) Applicant: Lam Research Corporation, Fremont, CA (US)

(72) Inventors: Aaron Bingham, Sherwood, OR (US); Patrick Van Cleemput, West Linn, OR (US)

(73) Assignee: Lam Research Corporation, Fremont, CA (US)

(*) Notice: Subject to any disclaimer, the term of this patent is extended or adjusted under 35 U.S.C. 154(b) by 277 days.

(21) Appl. No.: 15/786,497

(22) Filed: Oct. 17, 2017

(65) Prior Publication Data

US 2019/0115190 A1    Apr. 18, 2019

(51) Int. Cl.
*H05H 1/24* (2006.01)
*H01J 37/32* (2006.01)
*H05H 1/46* (2006.01)

(52) U.S. Cl.
CPC .... *H01J 37/32082* (2013.01); *H01J 37/3255* (2013.01); *H01J 37/32091* (2013.01);
(Continued)

(58) Field of Classification Search
CPC .... H05H 1/24; H05H 1/46; H05H 2001/4645; H05H 2001/4697; H01J 37/32082; H01J 37/32091; H01J 37/32137; H01J 37/32541
See application file for complete search history.

(56) References Cited

U.S. PATENT DOCUMENTS

| 5,230,740 | A | * | 7/1993 | Pinneo | H01J 37/32192 |
|---|---|---|---|---|---|
| | | | | | 118/715 |
| 5,712,592 | A | | 1/1998 | Stimson et al. | 330/124 R |

(Continued)

FOREIGN PATENT DOCUMENTS

| EP | 0731559 A1 | | 11/1996 | ............. H03H 11/30 |
|---|---|---|---|---|
| JP | 6-216081 | * | 8/1994 | ............. H01L 21/302 |
| WO | WO 2009/115135 A1 | * | 9/2009 | ............. H01J 37/32 |

OTHER PUBLICATIONS

Zhang, Yiting, et al., "Control of ion energy distributions using phase shifting in multi-frequency capacitively coupled plasmas". Journal of Applied Physics 117, 233302 (2015), pp. 1-15.*

(Continued)

*Primary Examiner* — Bret P Chen
(74) *Attorney, Agent, or Firm* — Penilla IP, APC

(57) ABSTRACT

Methods for controlling glow discharge in a plasma chamber are disclosed. One method includes connecting a radio frequency (RF) generator to a top electrode of a chamber, the chamber having chamber walls coupled to ground and connecting the RF generator to a bottom electrode of the chamber. Identifying a process operation of deposition to be performed in the chamber and setting an RF signal from the RF generator to be supplied to the top electrode at a first phase. And, setting the RF signal from the RF generator to be supplied to the bottom electrode at a second phase. The first phase and the second phase being adjustable to a phase difference to cause the plasma glow discharge to be controllably positioned within the chamber based on the phase difference.

11 Claims, 8 Drawing Sheets

(52) U.S. Cl.
CPC .. *H01J 37/32137* (2013.01); *H01J 37/32541* (2013.01); *H01J 37/32577* (2013.01); *H05H 1/24* (2013.01); *H05H 1/46* (2013.01); *H05H 2001/4682* (2013.01); *H05H 2001/4697* (2013.01)

(56) References Cited

U.S. PATENT DOCUMENTS

| | | | | |
|---|---|---|---|---|
| 5,866,872 | A * | 2/1999 | Lu | B23K 10/006 219/121.54 |
| 6,028,287 | A * | 2/2000 | Passage | B23K 10/006 219/121.54 |
| 9,460,915 | B2 * | 10/2016 | Varadarajan | H01J 37/32715 |
| 2002/0149317 | A1 * | 10/2002 | Nakano | H01J 37/32082 315/111.11 |
| 2003/0168427 | A1 * | 9/2003 | Flamm | H01J 37/32174 216/2 |
| 2006/0049138 | A1 * | 3/2006 | Miyake | H01J 37/321 216/58 |
| 2008/0180028 | A1 * | 7/2008 | Collins | C23C 16/45574 315/111.21 |
| 2009/0202741 | A1 | 8/2009 | Stimson et al. | 417/569 |
| 2009/0284156 | A1 * | 11/2009 | Banna | H01J 37/321 315/111.21 |
| 2009/0290673 | A1 * | 11/2009 | Svidzinski | G21B 1/05 376/133 |
| 2010/0099263 | A1 | 4/2010 | Kao et al. | 438/703 |
| 2010/0276391 | A1 * | 11/2010 | Grimbergen | H01J 37/321 216/41 |
| 2011/0192349 | A1 * | 8/2011 | Hammond, IV | C23C 16/509 118/723 E |
| 2012/0097641 | A1 * | 4/2012 | Beckmann | H01J 37/32091 216/67 |
| 2014/0225503 | A1 * | 8/2014 | Mori | H01J 37/32183 315/111.21 |
| 2015/0102239 | A1 * | 4/2015 | Yanagida | H05G 2/008 250/504 R |
| 2017/0004955 | A1 * | 1/2017 | Leeser | H01J 37/32137 |

OTHER PUBLICATIONS

Dudnik, Yu D., et al, "Plasma injector for a three-phase plasma torch with rail electrodes and some results of its investigation". J. Phys.: Conf. Ser. 946 (2018) 012167, pp. 1-5.*

Rahul, R., et al., "Optical and RF electrical characteristics of atmospheric pressure open-air hollow slot microplasmas and application to bacterial inactivation". J. Phys. D: Appl. Phys. 38 (2005) 1750-1759.*

Proschek, M., et al., "The effect of phase difference between powered electrodes on RF plasmas". Plasma Sources Sci. Technol. 14 (2005) 407-411.*

Arambhadiya, Bharat, et al., "Automation of Aditya tokamak plasma position control DC power supply". Fusion Engineering and Design 112 (2016) 714-717.*

Ambrosino, Giuseppe, et al., "Magnetic Control of Plasma Current, Position, and Shape in Tokamaks". IEEE Control Systems Magazine, Oct. 2015, pp. 76-92.*

Anand, H., et al., "A novel plasma position and shape controller for advanced configuration development on the TCV tokamak." Nuclear Fusion, 57(12), (2017). [126026]. https://doi.org/10.1088/1741-4326/aa7f4d.*

PCT/US2018/053129, PCT International Search Report, PCT/ISA/210, dated Jan. 2, 2019.

* cited by examiner ved in the chamber. The method further includes setting an RF signal from the RF generator to be supplied to the top electrode at a first phase and setting the RF signal from the RF generator to be supplied to the bottom electrode at a second phase. The first phase and the second phase are adjustable to a phase difference to cause the plasma glow discharge to be controllably positioned within the chamber based on the phase difference.

METHODS FOR CONTROLLING PLASMA GLOW DISCHARGE IN A PLASMA CHAMBER

FIELD OF THE DISCLOSURE

The present embodiments relate to methods for controlling plasma glow discharge of plasma between electrodes of a plasma chamber, and more particularly, to methods for controlling the phase between radio frequency (RF) power signals provided to each of a showerhead and a pedestal of the plasma chamber.

BACKGROUND

Plasma-enhanced chemical vapor deposition (PECVD) is a type of plasma deposition that is used to deposit thin films from a gas state (i.e., vapor) to a solid state on a substrate such as a wafer. PECVD systems convert a liquid precursor into a vapor precursor, which is delivered to a chamber. PECVD systems may include a vaporizer that vaporizes the liquid precursor in a controlled manner to generate the vapor precursor. Plasma chambers are used to deposit precision material layers using plasma enhanced atomic layer deposition (PEALD) process. Similarly, plasma is used in chambers optimized for removing materials from substrates.

These systems share the need to strike a plasma from gases introduced into the chamber, which is referred to herein as the plasma glow discharge that results from providing power to one or more electrodes of a chamber. A current challenge with any system that relies on igniting plasma between electrodes is control of the glow discharge. For example, once the glow discharge is produced between electrodes, it is not typically possible to influence positioning parts of all of the plasma bulk in different locations or regions within the chamber. To address these issues, current technologies rely on either multiple frequencies and/or multiple RF generators to control the glow discharge in PECVD, PEALD, or etch.

It is in this context that embodiments arise.

SUMMARY

Methods and systems controlling a plasma glow discharge within a chamber are provided. A phase difference is controlled for an RF signal supplied to both a top electrode and a bottom electrode from an RF power supply. Control of the phase difference assists in controlling positioning of the plasma glow discharge from being substantially between the top and bottom electrodes to being away from the top and bottom electrodes and proximate to chamber walls of the chamber, which are grounded.

In one embodiment, a method for controlling positioning of plasma glow discharge is disclosed. A radio frequency (RF) generator is connected to a top electrode of a chamber and the chamber has chamber walls coupled to ground. The RF generator is connected to a bottom electrode of the chamber. The method includes identifying a process operation of deposition to be performed in the chamber. The method further includes setting an RF signal from the RF generator to be supplied to the top electrode at a first phase and setting the RF signal from the RF generator to be supplied to the bottom electrode at a second phase. The first phase and the second phase are adjustable to a phase difference to cause the plasma glow discharge to be controllably positioned within the chamber based on the phase difference.

An apparatus for processing a substrate is disclosed. The apparatus includes a chamber having chamber walls connected to ground and a radio frequency (RF) power supply. A top electrode is connected to the RF power supply and a bottom electrode connected to the RF power supply. A phase change control is connected to an output of the RF power supply for controlling a first phase of an RF signal supplied by the RF power supply to the top electrode and a second phase of the RF signal supplied by the RF power supply to the bottom electrode. A controller is in communication with the phase change control for adjusting a phase difference between the first phase and the second phase to adjust a position of a plasma glow discharge within the chamber.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe methods, devices, systems, and computer programs for controlling or setting a phase difference between the RF power signals delivered to each of the top electrode (e.g., showerhead) and bottom electrode (e.g., pedestal) to influence a location or positioning of a bulk of the plasma glow discharge within the plasma chamber. It will be apparent, that the present embodiments may be practiced without some or all of these specific details. In other instances, well-known process operations have not been described in detail in order not to unnecessarily obscure the present embodiments.

In one embodiment, a single RF generator is connected to both a showerhead and a pedestal. In this configuration, the showerhead functions as a top electrode and the pedestal functions as a bottom electrode. In one example, the single RF generator is configured to supply half of the RF power to the electrode of the showerhead and half of the RF power to the electrode of the pedestal, while controlling a phase difference between the delivered RF power signals. In one example, the RF power signal provided to the electrode of the showerhead is 180 degrees out-of-phase with the RF power signal provided to the electrode of the pedestal. In another example, the RF power signal provided to the electrode of the showerhead is 0 degrees out-of-phase (e.g., in-phase) with the RF power signal provided to the electrode of the pedestal. In still another example, by controlling an amount between 0 and 180 degrees out-of-phase of the RF power signals, it is possible to influence a shape and/or positioning of the plasma glow discharge of the plasma in the chamber. By way of example, by changing the phase, the system enables focusing the plasma glow discharge to be substantially between the top and bottom electrodes or way from the top and bottom electrodes and toward the grounded chamber walls, which provide a ground return.

In some embodiments, the phase difference is set by selecting cable lengths from the RF generator to each of the electrodes. In other embodiments, electronics interfaced with a controller of the chamber are programmable to automatically set and control the phase change/shift between the RF going to both electrodes. In some embodiments, cable lengths and controller control can function together to provide fine tuning to position the plasma glow discharge in a desired position. The embodiments described herein are not limited to any frequencies. Several of the embodiments described herein may use frequencies between about 100 KHz to about 100 MHz, and in particular, some example frequencies include about 400 KHz, about 2 MHz, about 13.56 MHz, about 27 MHz, about 60 MHz, etc.

Figure 1:
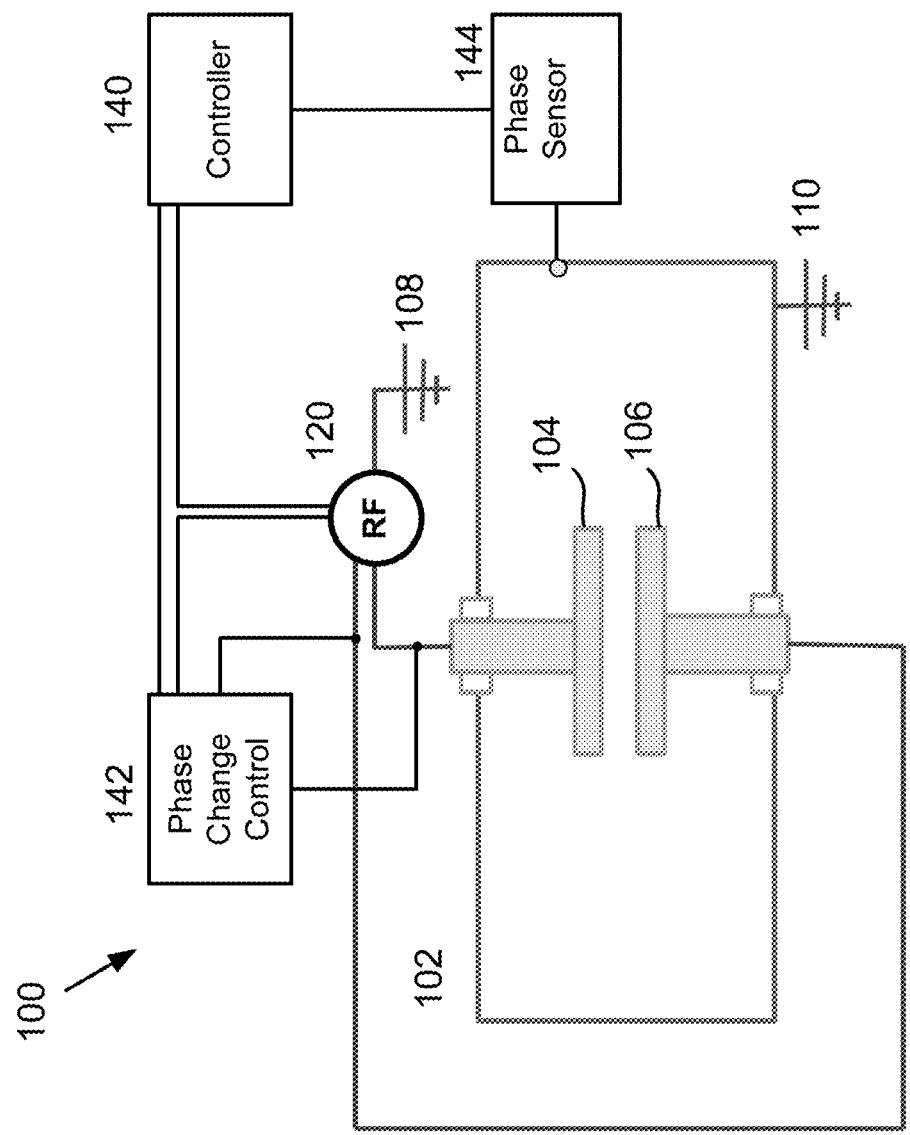
FIG. 1 illustrates an example of a plasma chamber, which includes a chamber having chamber walls for processing a substrate, in accordance with one configuration.

FIG. 1 illustrates an example of a plasma chamber 100, which includes a chamber having chamber walls 102 for processing a substrate. The chamber wall 102 is grounded 110. In one embodiment, a bottom electrode 106 functions as a pedestal for supporting a substrate. Top electrode 104 functions as a showerhead for delivering gases useful for depositing or etching materials. In one configuration, a radio frequency (RF) power supply 120 is coupled at one and to ground 108, and is coupled to both the top electrode 104 and the bottom electrode 106 simultaneously. As shown, a phase change control 142 is connected to the output of the RF power supply 120 and interfaced with the controller 140. Phase change control 142, in one embodiment, is used for modifying the phase of an RF signal being output by the RF power supply 120.

The phase change control 142 is configured to adjust a phase difference between a first phase delivered to the top electrode 104 and a second phase delivered to the bottom electrode 106 for the same RF signal output by the RF power supply 120. The phase sensor 144 is connected to the chamber through a port of the chamber wall 102. The phase sensor 144 is configured to monitor and sense an interior region of the chamber in order to determine a position or substantial concentration of the plasma glow discharge. If the plasma glow discharge is concentrated between the top electrode 104 and the bottom electrode 106, then the phase sensor 144 will determine that the phase between the RF signal delivered to the top electrode 104 and the bottom electrode 106 is substantially 180° degrees out-of-phase.

If the sensor determines that the concentration of the plasma glow discharge is substantially proximate to the chamber walls 102, then the sensor will determine that the phase between the RF signal delivered to the top electrode 104 and the bottom electrode 106 is substantially 0° degrees out-of-phase, or substantially in-phase. In some embodiments, the phase sensor 144 operates as a phase detector, which can monitor or sense current and voltage characteristics within the chamber. In some embodiments, the phase sensor 144 can be defined by a plurality of detectors integrated within different locations facing the interior of the chamber. In this manner, more accurate detection of phase and intensities of the plasma glow discharge can be made, for determining or approximating the phase difference present in the chamber during processing or before processing.

In one embodiment, the phase sensor 144 may be a voltage-current (VI) probe utilized to capture voltage and current measurements from the chamber during operation. By way of example, a VI probe may be connected outside of the chamber, e.g., via electrical coupling to an electrode (i.e., showerhead electrode or pedestal electrode), or can be coupled to an inside surface, port or extension facing an interior region of the chamber or toward one or both electrodes. Some example probes include custom built probes or VI probes manufactured by equipment suppliers, e.g., VI probes made by MKS Instruments, Inc., VI probes made by Bird Technologies, or others. In some embodiments, phase sensor 144 may be implemented as a magnitude phase detector that receives and processes voltage and current signals to detect phase. Still further, other types of systems, such as oscilloscopes, network analyzers and test equipment may also be used to monitor the phase within a chamber.

In some embodiments, the phase change control 142 can be used to sense the phase of the RF signal supplied to each of the top electrode and bottom electrode. By way of example, the phase is controlled by selecting a cable length between the output of the RF power supply 120 and each of the top and bottom electrodes 104 and 106. The phase change control 142 can therefore sense the RF signal and make adjustments if necessary, based on control received from the controller 140. Controller 140 is also shown interfaced with the RF power supply 120, which provides control during operation.

Figure 2:
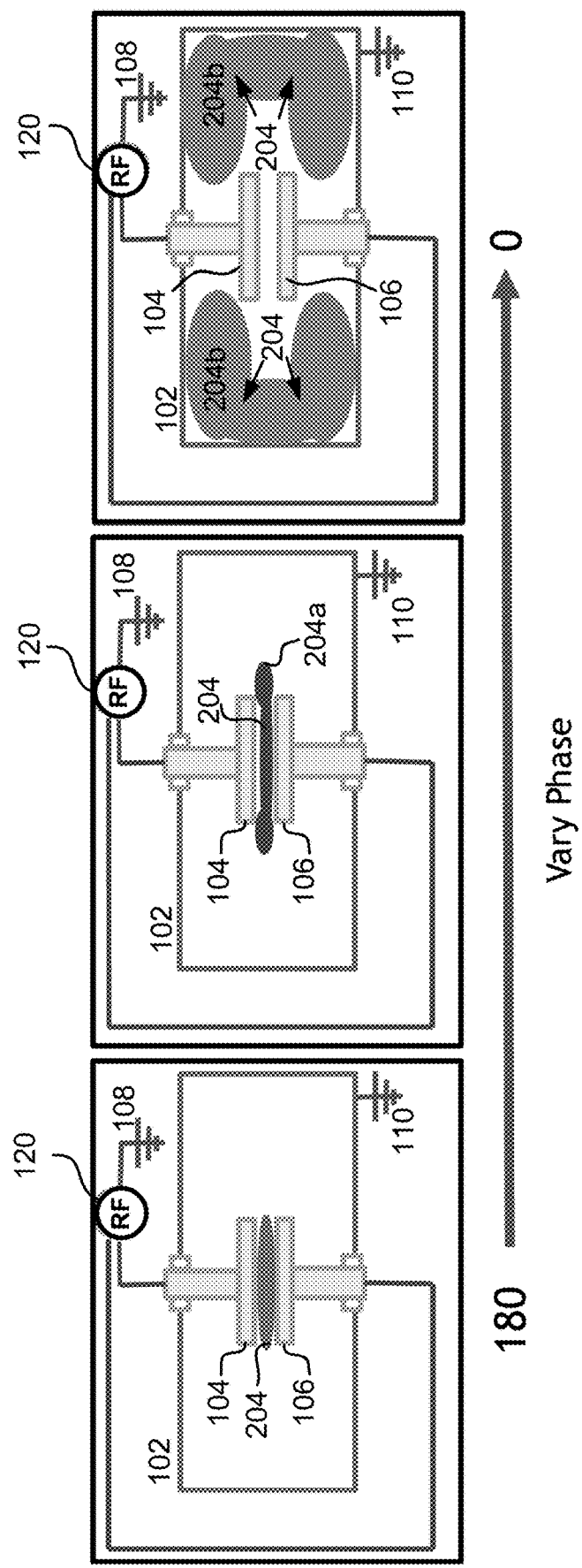
FIG. 2 illustrates an example of the functionality provided by varying the phase between the first phase delivered to the top electrode and the second phase delivered to the bottom electrode, as delivered by the RF signal supplied by the RF power supply.

FIG. 2 illustrates an example of the functionality provided by varying the phase between the first phase delivered to the top electrode 104 and the second phase delivered to the bottom electrode 106, as delivered by the RF signal supplied by the RF power supply 120. In this example, when the first phase and the second phase are set to be approximately 180° degrees out-of-phase, the plasma glow discharge 204 will be predominantly contained between the top electrode 104 and bottom electrode 106, while maintaining the chamber walls 102 at ground 110. At the other extreme, when the RF signal supplied to the top electrode 104 and the bottom electrode 106 are delivered in-phase, e.g. 0° degrees out-of-phase, the plasma glow discharge 204b is forced or shifted toward the chamber walls 102, which provide a path to ground 110.

In one embodiment, shifting the plasma glow discharge 204b toward the chamber walls 102 can be utilized during other processing applications. By way of example, chamber wall cleaning can also be optimized by placing the first phase of the RF signal delivered to the top electrode 104 and the second phase of the RF signal delivered to the bottom electrode 106 to be in-phase. At this point, the shifted plasma glow discharge 204b can be optimized while flowing the gas mixture of helium and hydrogen. This gas mixture is optimized to produce hydrogen radicals *H (e.g., in-situ low lifetime radicals), which operate to etch byproducts that are adhered to the surfaces of the plasma chamber or other parts that surround the electrodes within the chamber.

This provides for no plasma between the electrodes 104 and 106 and all the plasma and potential flows to ground 110 of the chamber walls or structures within the chamber that are also grounded. In one embodiment, this chamber cleaning configuration can replace remote plasma cleaning (RPC) for low-temperature processes with no damage between the electrodes. This further allows for removal of substantial plumbing and integration parts within the chamber, as RPC would no longer be required. In some embodiments, different chemistries can be utilized to perform cleaning within the chamber or chamber parts. It should be understood that hydrogen and helium gas mixtures are only provided as one example chemistry combination.

At some phase between 180° degrees out-of-phase and 0° degrees out-of-phase, the plasma glow discharge 204 can be forced to have a peripheral plasma glow discharge 204a, which elongates or shapes the plasma glow discharge 204. This control provides for uniformity tuning of the deposition process during the deposition operation. By way of example, if more or less plasma glow discharge 204 is desired in the periphery and less is desired substantially in the middle of the substrate, then the phase is shifted from being 180° degrees out-of-phase toward some value closer to 0° degrees out-of-phase. In one example, 90° degrees out-of-phase may provide for some peripheral plasma glow discharge 204a, which reduces the density of plasma in the center region over the substrate being processed, and produces more peripheral plasma glow discharge near the edges of the substrate.

As can be appreciated, varying the phase difference between the first phase delivered to the top electrode 104 and the second phase delivered to the bottom electrode 106 can provide a useful tuning knob for shaping the plasma glow discharge over the substrate during processing. Adjustments to the phase difference can be made in situ, during processing or can be pre-identified for specific processing recipes. In some embodiments, feedback signals received from the phase sensor 144 are utilized by the controller 140 in order to dynamically and in real time adjust the phase for optimizing the deposition process or etching process.

Figure 3:
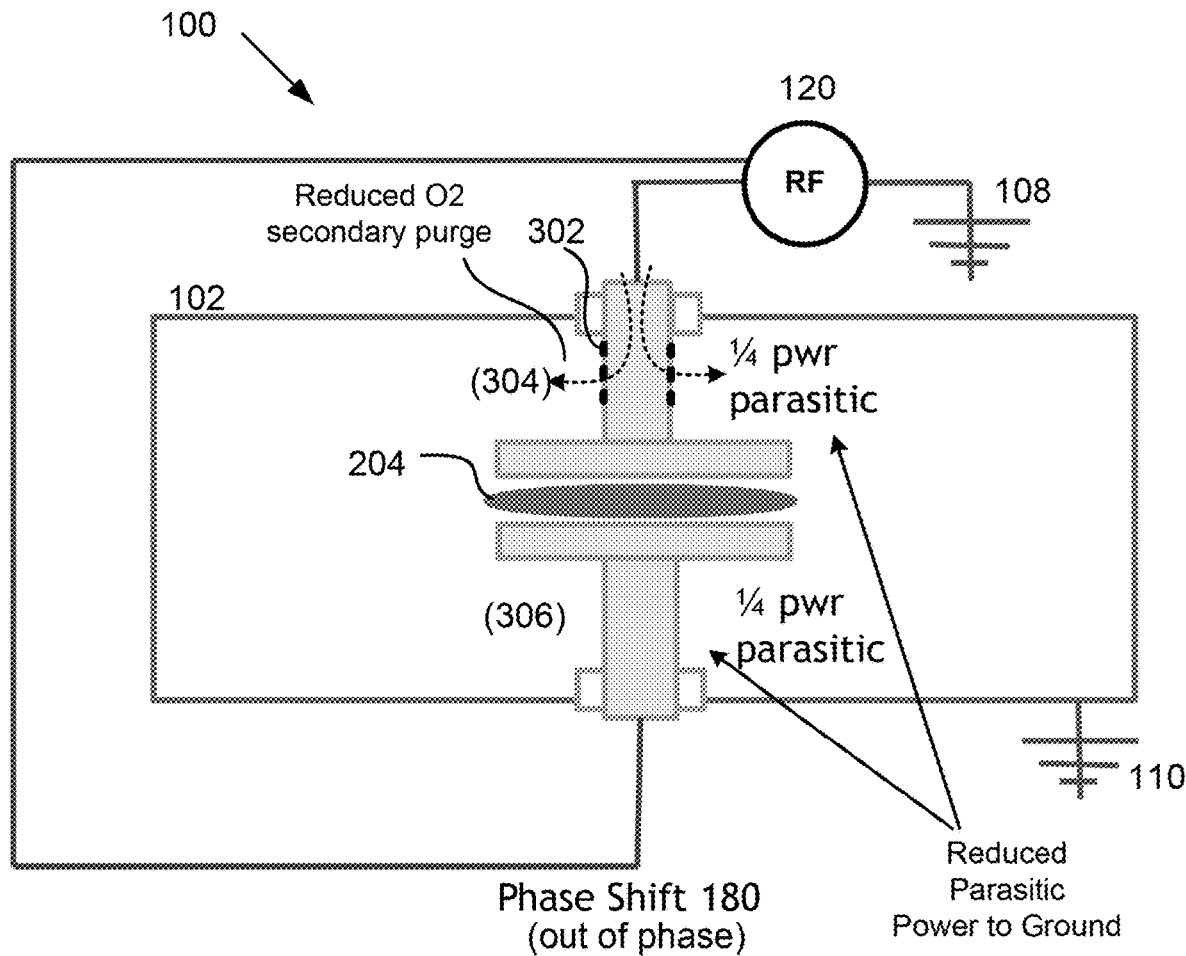
FIG. 3 illustrates an example configuration of the processing chamber, and certain technical advantages obtained by splitting the RF power delivered to the top electrode and bottom electrode, in accordance with one embodiment.

FIG. 3 illustrates an example configuration of the processing chamber 100, and certain advantages obtained by splitting the RF power delivered to the top electrode 104 and bottom electrode 106, in accordance with one embodiment. As shown, a plurality of ports 302 are provided to enable purging gas to be input during processing to reduce parasitic plasma generation and regions that are not desired. By way of example, a region above the top electrode 104 is a region where parasitic plasma is not desired during processing, and therefore the ports 302 are utilized to provide an oxygen secondary purge.

The oxygen secondary purge is utilized to combat the parasitic plasma that forms above the region over the top electrode 104. In accordance with one embodiment, by splitting the RF signal output from the RF power supply 120 to both the top electrode 104 and bottom electrode 106 (during a 180° degrees out-of-phase shift), half of the voltage that would normally be supplied to the top electrode 104 will be split into approximately one fourth parasitic power to ground (V2/R). As a result, region 304 will have approximately one fourth parasitic power by splitting the RF power which is shared between the top electrode 104 and the bottom electrode 106. Region 306 will also have reduced parasitic power, which again reduces generation of particles outside of the processing area between top electrode 104 and bottom electrode 106.

One additional technical benefit is that because the parasitic power in region 304 has been decreased, an oxygen secondary purge can also be substantially reduced. The oxygen secondary purge is used to prevent ignition of plasma, but when the parasitic power is reduced in regions 304 and 306, a substantial reduction in oxygen secondary purge gases can be achieved.

Figure 4:
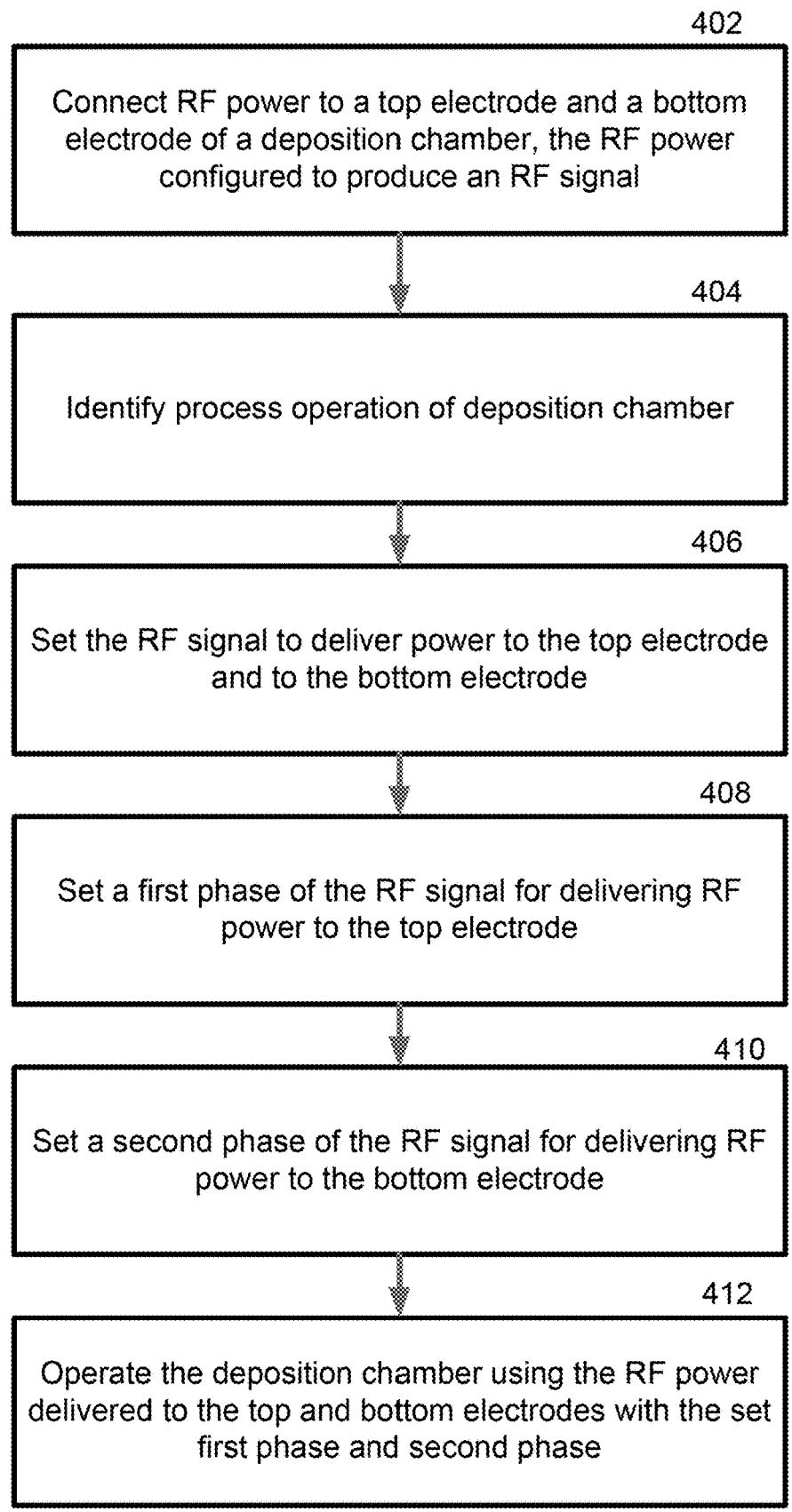
FIGS. 4-8 provide example method flows, in accordance with several embodiments of the disclosure.

FIG. 4 illustrates one example flow diagram of a method that can be processed, in accordance with one embodiment. In operation 402, RF power is connected to a top electrode and a bottom electrode of a deposition chamber. The RF power is configured to produce an RF signal that will be provided to each of the top and bottom electrodes. In operation 404, a process operation of deposition to be carried out in the chamber is identified. By way of example, different types of processing operations for different types of depositions or etches can be performed within the chamber 100, and identification of the process operation is needed to determine settings to be made for the chamber and/or settings to be applied by the controller 140.

In operation 406, the RF signal is set to deliver power to the top electrode and the bottom electrode. The RF signal is output from the RF power supply 120, and is split to provide the RF signal to both the top and bottom electrodes. In operation 408, a first phase of the RF signal is set for delivering RF power to the top electrode 104. In operation 410, a second phase of the RF signal is set for delivering RF power to the bottom electrode 106. As mentioned above, a phase difference between the first phase and the second phase is adjusted to achieve the desired plasma glow discharge within the chamber, in accordance with the desired processing for the deposition operation or recipe. In operation 412, the deposition chamber is operated using the RF power delivered to the top and bottom electrodes with the set first phase and second phase.

Figure 5:
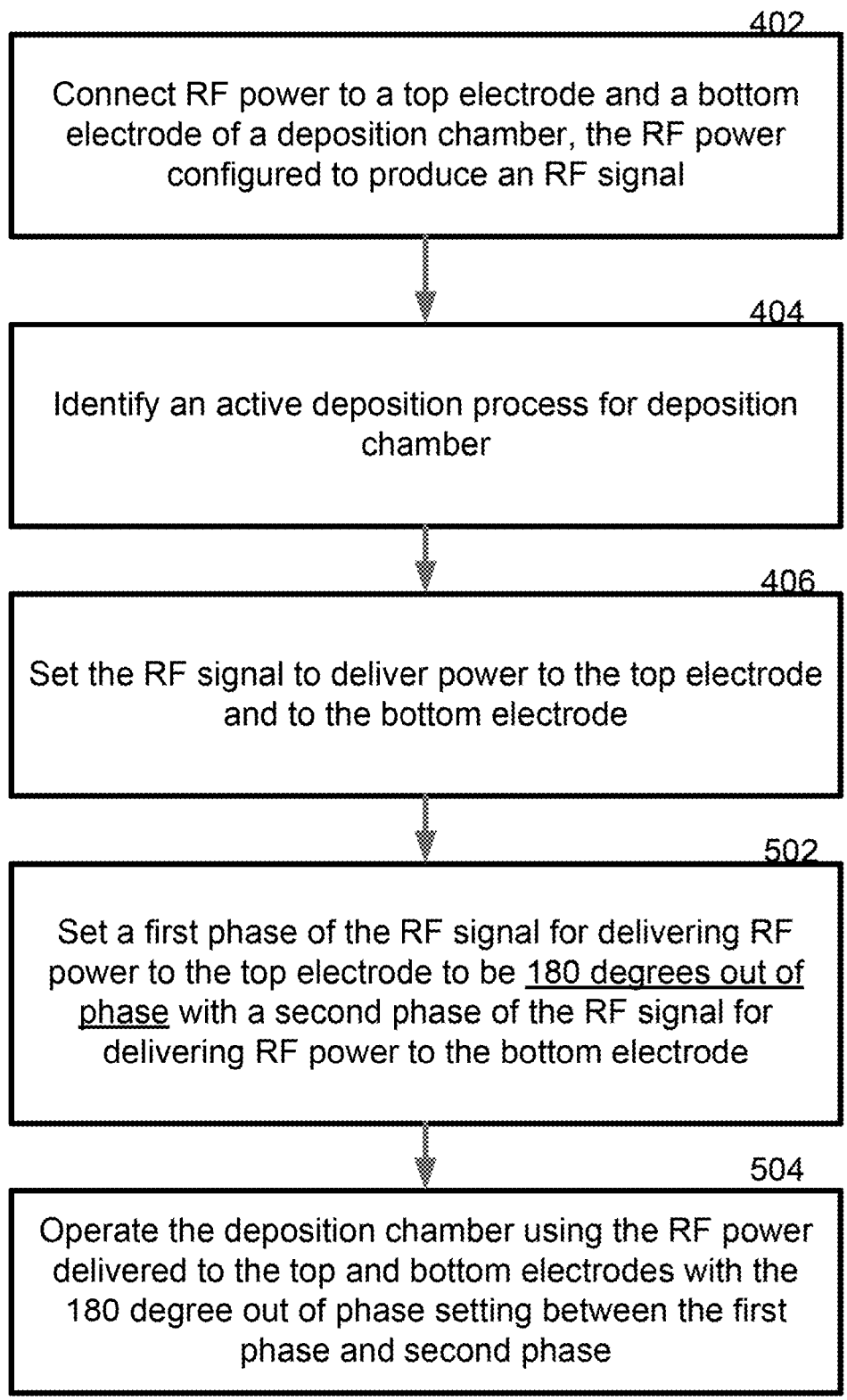

FIG. 5 illustrates another example flow diagram of a method for processing a deposition operation in the chamber, while controlling the desired phase difference delivered to the top and bottom electrodes. Operations 402 to 406 are as described with reference to FIG. 4. In operation 502, a first phase of the RF signal is set to deliver RF power to the top electrode while setting the first phase of the RF signal to be 180° degrees out-of-phase with the second phase of the RF signal. As described above, it is believed that setting the phase to be 180° degrees out-of-phase will achieve a concentration of the plasma glow discharge substantially between the electrodes 104 and 106. In operation 504, the deposition chamber is operated using the RF power delivered to the top electrode and the bottom electrodes with the 180° degrees out-of-phase setting between the first phase and second phase.

Figure 6:
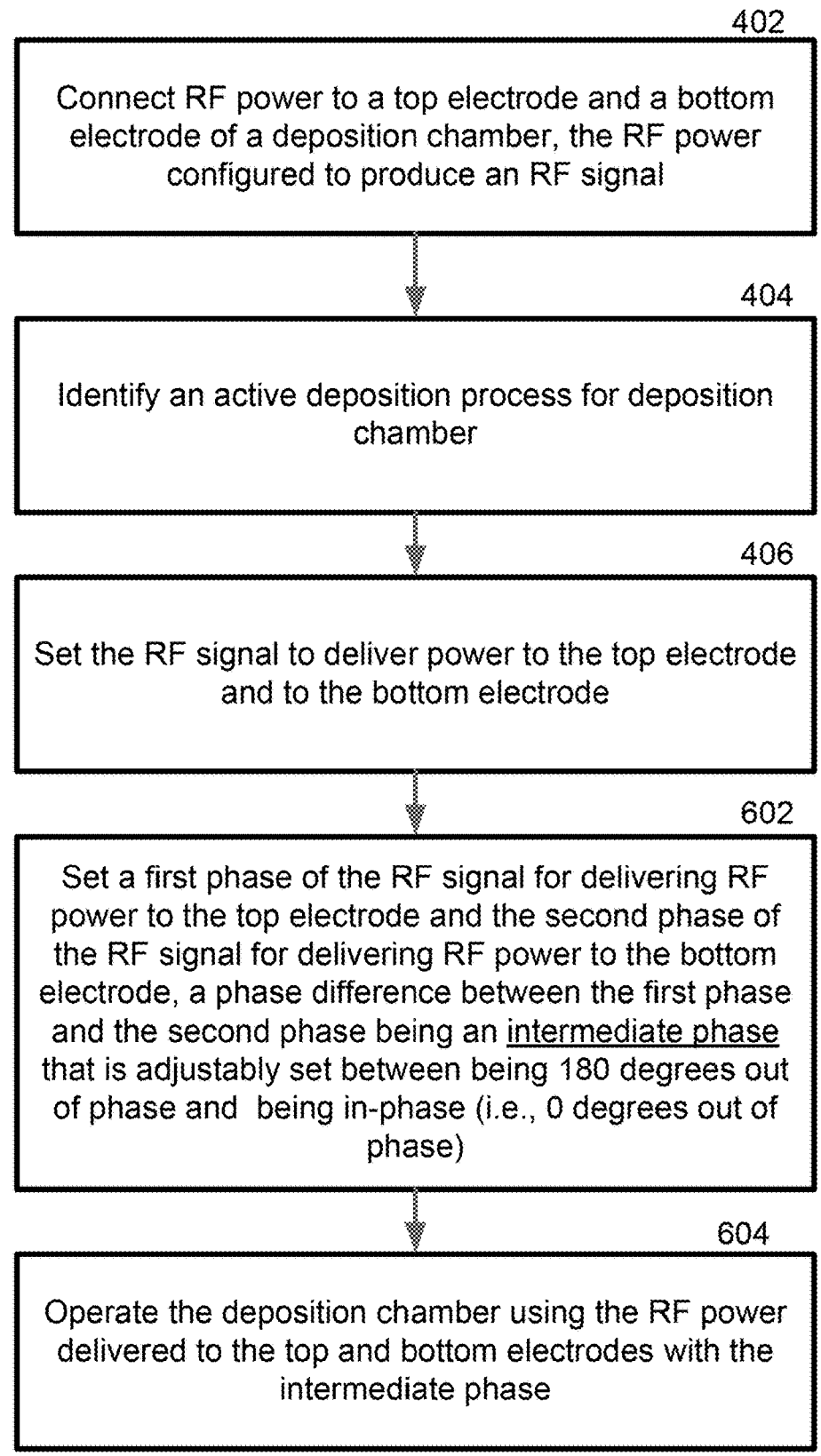

FIG. 6 illustrates another example flow diagram of a method for processing a deposition operation in the chamber, while controlling the desired phase difference delivered to the top and bottom electrodes. Operations 402 to 406 are as described with reference to FIG. 4. In operation 602, a first phase of the RF signal is set for delivering RF power to the top electrode and the second phase of the RF signal is set for delivering power to the bottom electrode. A phase difference between the first phase and the second phase is set at an intermediate phase that is adjustably set between 180° degrees out-of-phase and 0° degrees out-of-phase (in-phase). This provides for adjustment of the plasma glow discharge to be substantially between the electrodes or the case where the plasma glow discharge begins to emanate out from the edges of the electrodes to produce the peripheral plasma glow discharge. The deposition chamber is then operated using the RF power delivered to the top and bottom electrodes with the intermediate phase in operation 604.

Figure 7:
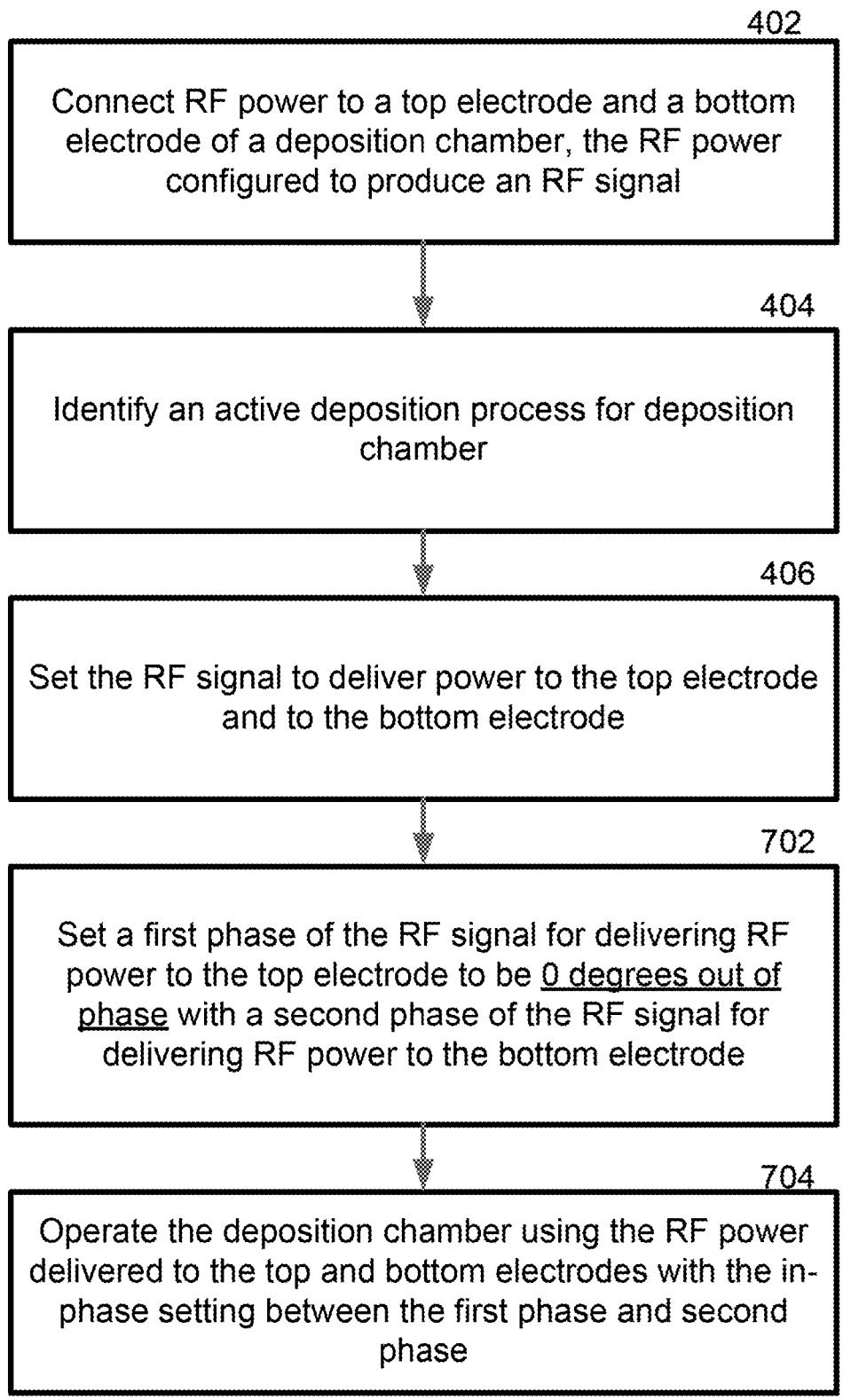

FIG. 7 illustrates another example flow diagram of a method for processing a deposition operation in the chamber, while controlling the desired phase difference delivered to the top and bottom electrodes. Operations 402 to 406 are as described with reference to FIG. 4. In operation 702, a first phase of the RF signal for delivering RF power to the top electrode is set to be 0° degrees out-of-phase with a second phase of the RF signal set for delivering RF power to the bottom electrode.

By way of example, this places the first phase and the second phase substantially in-phase, that forces the plasma glow discharge to be shifted to the chamber walls 102, in search for a path to ground 110. As mentioned above, this particular setting can be utilized for plasma cleaning, e.g., when no wafer is present over the pedestal. As further mentioned above, a gas mixture of helium and hydrogen can be supplied through the showerhead in order to produce the plasma glow discharge and low lifetime radicals *H, useful for cleaning the periphery regions around the top electrode 104 and bottom electrode 106 within the chamber or chamber walls or parts that are grounded within the chamber inner surfaces.

Figure 8:
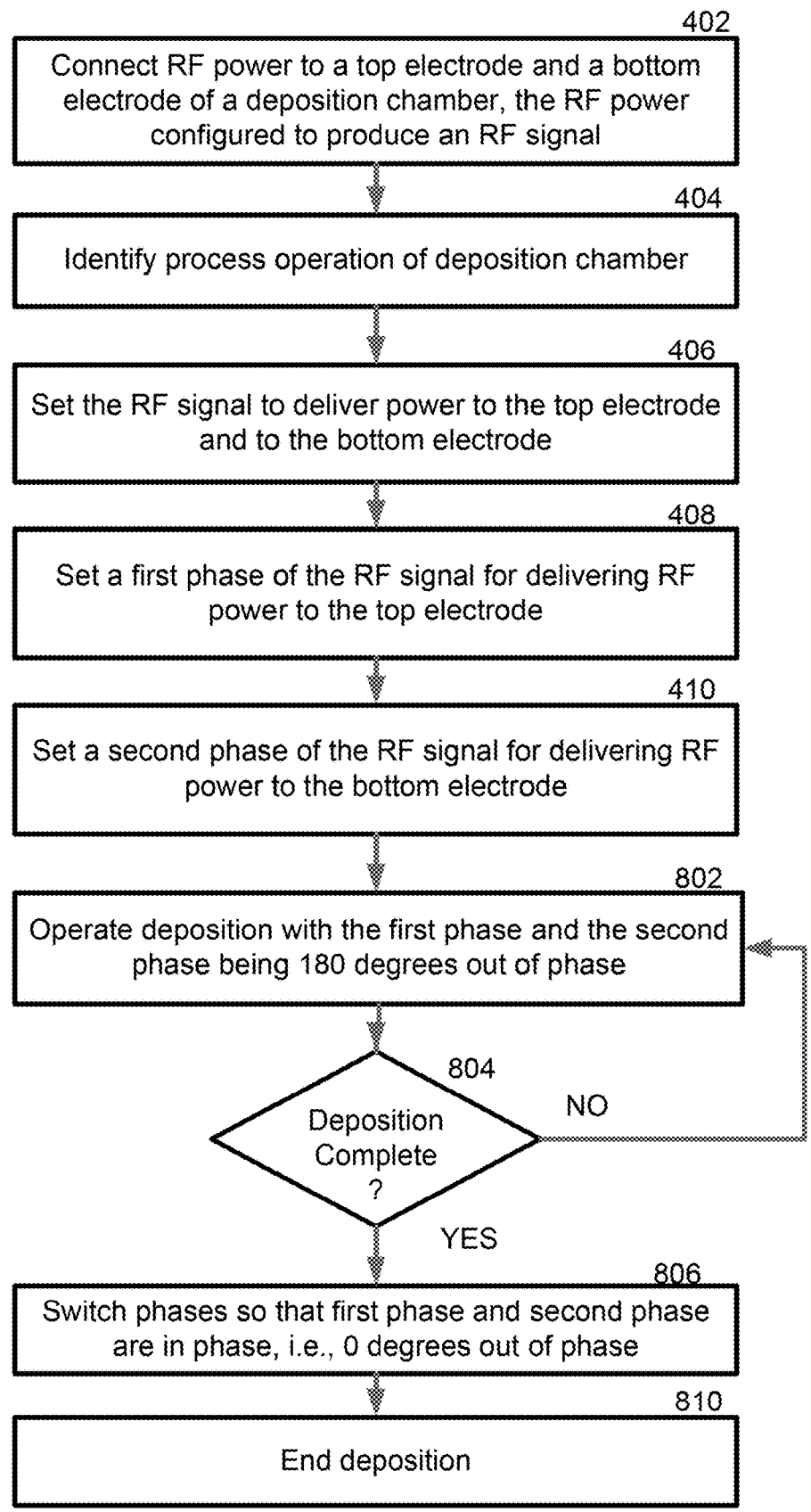

FIG. 8 illustrates another example flow diagram of a method for processing a deposition operation in the chamber, while controlling the desired phase difference delivered to the top and bottom electrodes. Operations 402 to 410 are as described with reference to FIG. 4. In this method, it is possible to control the phase difference between the first and second phases during a process sequence. The process sequence may be, for example, a main deposition process followed by termination of the deposition process, where the phase is changed between the main deposition process and the termination of the deposition process.

In operation 802, the deposition process is operated with the first phase and the second phase being substantially 180° degrees out-of-phase. The deposition process will continue until it is determined that the deposition process is complete in operation 804. Once the deposition process has been determined to be complete, the phases are switched so that the first phase and the second phase are substantially in-phase, e.g., 0° degrees out-of-phase. This forces the plasma glow discharge away from over the substrate and toward the chamber walls 102. Once the plasma has been removed from over the wafer, by way of the phase switch of operation 806, the deposition operation can end in operation 810. Ending the deposition operation will include turning off the RF power supply.

By performing the phase switch before turning off the power supply, it is possible to avoid deposition of excess particles over the wafer, and drive any excess particles that result at the end of an etch or deposition operation to be substantially forced toward the chamber walls and/or other ground surfaces near or in proximity to the grounded chamber walls. More specifically, by controlling the location and positioning of the plasma glow discharge, it is possible to reduce particulate generation over the wafer at the completion of a process operation, and force those particles near or at the chamber walls away from the wafer. This places the plasma remote from the wafer just before RF power is turned off to end the plasma glow discharge. As can be appreciated, this process can improve wafer deposition performance.

As mentioned above, the disclosed configurations has many advantages over the prior art. Some example advantages include a much lower parasitic discharge between electrode and chamber in 0° phase shift implementation (e.g., reduced to about 25% of standard RF set-up). In configurations without the current embodiments, PECVD small particles are suspended in the plasma and land on the wafer when the plasma is extinguished. To combat this, a DC bias is added to keep the plasma lit faintly at all times, which leads to extra cost and complications. In accordance with the embodiment described in FIG. 8, the plasma can be quickly moved away from the electrodes to extinguish and dump any small particles far away from the wafer services.

Still further, in the 0° phase shift condition, the plasma discharge is outside the electrodes and uses the chamber wall as the path to ground. As discussed with reference to FIG. 3, this condition can be used to produce H* radicals locally, eliminating the fast recombination issues when the radicals are generated between the electrodes. In some experiments, the 0° phase shift condition was used to remove tinoxide ($SnO_2$) by a low temperature (<50° C.) H* radical clean.

Additionally, PECVD Carbon (AHM) has a hard time removing C from the far corners of the reactor. As the C material becomes more and more diamond like, it also starts to be conductive and have an adverse effect on the RF behavior. Thus, reactor (i.e., chambers) cleans are required between every wafer or every other wafer or periodically. Thus, the embodiments described herein provide for a very fast C-removal tailored to certain areas in the reactor.

In one embodiment, the controller 140, described with reference to FIG. 1 above may include a processor, memory, software logic, hardware logic and input and output subsystems communicating with, monitoring and controlling a plasma processing system. The controller 140 may also handle processing of one or more recipes including multiple set points for various operating parameters (e.g., voltage, current, frequency, pressure, flow rate, power, temperature, etc.), e.g., for operating a plasma processing system. Furthermore, although more detailed examples were provide with reference to etching operations (e.g., etching tools), it should be understood that the operations can equally be utilized for deposition operations (e.g., deposition tools). For example, in the verification operations, instead of verifying etch performance, the verification can be of deposition performance. Deposition performance can be quantified in various ways, and without limitation, various types of metrology methods and/or tools may be used. Furthermore, deposition performance may be measured, sensed, approximated, and/or tested in-situ or off-line.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by a process that is engineered to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer.

In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relate to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A method for controlling positioning of plasma glow discharge, comprising:
   connecting a radio frequency (RF) generator to a top electrode of a chamber, the chamber having chamber walls coupled to ground;
   connecting the RF generator to a bottom electrode of the chamber;
   identifying a process operation of deposition to be performed in the chamber;
   setting an RF signal from the RF generator to be supplied to the top electrode at a first phase;
   setting the RF signal from the RF generator to be supplied to the bottom electrode at a second phase, the first phase and the second phase being adjustable to a phase difference to cause the plasma glow discharge to be controllably positioned;
   wherein a first setting of the phase difference causes the plasma glow discharge to be positioned more between the top electrode and the bottom electrode than toward chamber walls of the chamber and a second setting of the phase differences causes the plasma glow discharge to be positioned more toward chamber walls of the chamber and away from between the top electrode and bottom electrode.

2. The method of claim 1, wherein the setting of the first phase and the second phase is in response to controller input for adjusting to the phase difference.

3. The method of claim 2, wherein the first setting of the phase difference is set to place the first phase 180 degrees out-of-phase with the second phase, such that the RF signal supplied to the top electrode is 180 degrees out-of-phase with the RF signal supplied to the bottom electrode to influence said plasma glow discharge to be substantially contained between the top electrode and bottom electrode.

4. The method of claim 2, wherein the second setting of the phase difference is set to place the first phase 0 degrees out-of-phase with the second phase, such that the RF signal supplied to the top electrode is 0 degrees out-of-phase with the RF signal supplied to the bottom electrode to influence said plasma glow discharge to be substantially away from between the top electrode and bottom electrode and substantially concentrated toward the chamber walls.

5. The method of claim 2, wherein a third setting of the phase difference is set to place the first phase between about 180 degrees out-of-phase and 0 degrees out-of-phase with the second phase to influence said plasma glow discharge to be, between being substantially between the top electrode and bottom electrode and substantially away from the top electrode and bottom electrode and substantially moved toward the chamber walls.

6. The method of claim 1, wherein the first phase is set by a first cable length between the RF generator and the top electrode and the second phase is set by a second cable length between the RF generator and the bottom electrode.

7. The method of claim 6, wherein the first cable length is different than the second cable length.

8. The method of claim 1, wherein the first and second phases are set by a phase change control that is interfaced with a controller, the controller is configured to receive phase information from said chamber from a phase sensor, the phase information being used by the controller to make adjustments to the phase difference.

9. The method of claim 1, further comprising, adjusting a secondary oxygen purge flow based on reduced power parasitics in the chamber resulting from splitting RF power of the RF generator between the top electrode and the bottom electrode.

10. The method of claim 1, further comprising, setting the phase difference to be 0 degrees out-of-phase while supplying a hydrogen/helium gas flow into the chamber to produce hydrogen radicals, the hydrogen radicals used for cleaning at least part of the chamber walls from deposition particulates or residues.

11. The method of claim 1, wherein the process operation is a deposition operation, further comprising, performing the deposition operation while the phase difference is set at 180 degrees out-of-phase;

determining an end of the deposition operation;

switching the phase difference to be 0 degrees out-of-phase; and stopping the deposition operation after the switching.

* * * * *